US012740092B2

(12) United States Patent
Mebarki et al.

(10) Patent No.: US 12,740,092 B2
(45) Date of Patent: Sep. 15, 2026

(54) FORMATION OF METAL CAP ON METAL SILICIDE LAYER FOR CONTACT RESISTANCE REDUCTION

(71) Applicant: Applied Materials, Inc., Santa Clara, CA (US)

(72) Inventors: Bencherki Mebarki, Santa Clara, CA (US); Joung Joo Lee, San Jose, CA (US); Wenting Hou, San Jose, CA (US); Takashi Kuratomi, San Jose, CA (US); Avgerinos V. Gelatos, Scotts Valley, CA (US); Jianxin Lei, Saratoga, CA (US); Liqi Wu, San Jose, CA (US); Raymond Hoiman Hung, Palo Alto, CA (US); Tae Hong Ha, San Jose, CA (US); Xianmin Tang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 398 days.

(21) Appl. No.: 18/379,600

(22) Filed: Oct. 12, 2023

(65) Prior Publication Data

US 2024/0038859 A1 Feb. 1, 2024

Related U.S. Application Data

(62) Division of application No. 17/152,190, filed on Jan. 19, 2021, now abandoned.

(51) Int. Cl.

*H10D 30/62* (2025.01)
*H10D 64/01* (2025.01)

(Continued)

(52) U.S. Cl.

CPC ..... *H10D 30/6219* (2025.01); *H10D 64/0112* (2026.01); *H10D 84/013* (2025.01); *H10D 84/038* (2025.01)

(58) Field of Classification Search

CPC ............ H10D 30/6219; H10D 84/013; H10D 84/038; H10D 84/83; H10D 84/0149;

(Continued)

(56) References Cited

U.S. PATENT DOCUMENTS 10,438,891 B2 10/2019 Park et al.
10,818,768 B1 10/2020 Cheng et al.

(Continued)

FOREIGN PATENT DOCUMENTS

CN 109872954 A 6/2019
CN 110610903 A 12/2019

(Continued)

OTHER PUBLICATIONS

PCT International Search Report and Written Opinion in PCT/US2021/054650 dated Jan. 21, 2022, 13 pages.

*Primary Examiner* — John P. Dulka
(74) *Attorney, Agent, or Firm* — Servilla Whitney LLC

(57) ABSTRACT

A contact stack of a semiconductor device comprises: a source/drain region; a metal silicide layer above the source/drain region; a metal cap layer directly on the metal silicide layer; and a conductor on the metal cap layer. A method comprises: depositing a metal silicide layer in a feature of a substrate; in the absence of an air break after the depositing of the metal silicide layer, preparing a metal cap layer directly on the metal silicide layer; and depositing a conductor on the metal cap layer.

20 Claims, 7 Drawing Sheets

(51) Int. Cl.
*H10D 84/01* (2026.01)
*H10D 84/03* (2025.01)

(58) Field of Classification Search
CPC .......... H10D 84/0133; H01L 21/28518; H01L 23/53266; H01L 23/485; H01L 21/2855; H01L 21/28562; H01L 21/76843; H01L 21/28568
See application file for complete search history.

(56) References Cited

U.S. PATENT DOCUMENTS

2005/0191803 A1* 9/2005 Matsuse ............... H10D 64/664 257/E21.585
2008/0020535 A1 1/2008 Gulari et al.
2011/0086509 A1 4/2011 Ganguli et al.
2015/0118818 A1 4/2015 Yin et al.
2015/0206756 A1 7/2015 Gandikota et al.
2016/0204221 A1* 7/2016 He ......................... H10D 30/62 257/288
2018/0166329 A1 6/2018 Huang et al.
2018/0315646 A1* 11/2018 Tsai ...................... H01L 21/283
2019/0385908 A1 12/2019 Xie et al.
2020/0135858 A1 4/2020 Chiu et al.
2020/0203481 A1* 6/2020 Thareja ............. H01L 21/67184
2020/0203490 A1 6/2020 Thareja et al.
2020/0258997 A1 8/2020 Thareja et al.
2020/0411374 A1 12/2020 Huang et al.
2021/0098364 A1 4/2021 Yu et al.

FOREIGN PATENT DOCUMENTS

EP 0766302 A2 * 4/1997 ....... H01L 21/28556
KR 19970052540 A 7/1997
KR 20140041306 A 4/2014
KR 20190013342 A 2/2019
KR 20190099990 A 8/2019

* cited by examiner

FORMATION OF METAL CAP ON METAL SILICIDE LAYER FOR CONTACT RESISTANCE REDUCTION

CROSS-REFERENCE TO RELATED APPLICATIONS

This application is a Divisional Application of U.S. patent application Ser. No. 17/152,190, filed Jan. 19, 2021, the entire disclosure of which is hereby incorporated by reference herein.

TECHNICAL FIELD

Embodiments of the present disclosure generally relate to transistors and methods for forming transistors. In particular, transistor contacts, for example source/drain contacts, have reduced resistance.

BACKGROUND

Integrated circuits have evolved into complex devices that can include millions of transistors, capacitors, and resistors on a single chip. In the course of integrated circuit evolution, functional density (i.e., the number of interconnected devices per chip area) has generally increased while geometry size (i.e., the smallest component (or line) that can be created using a fabrication process) has decreased.

Microelectronic devices are fabricated on a semiconductor substrate as integrated circuits in which various conductive layers are interconnected with one another to permit electronic signals to propagate within the device. An example of such a device is a complementary metal-oxide-semiconductor (CMOS) field effect transistor (FET) or MOSFET, including both planar and three-dimensional structures. An example of a three-dimensional structure is a FinFET device.

Drive current, and therefore speed, of a transistor is proportional to a gate width of the transistor. Faster transistors generally require larger gate width. There is a trade-off between transistor size and speed, and “fin” field-effect transistors (finFETs) have been developed to address the conflicting goals of a transistor having maximum drive current and minimum size. FinFETs are characterized by a fin-shaped channel region that greatly increases the size of the transistor without significantly increasing the footprint of the transistor.

An exemplary finFET or MOSFET includes a gate electrode on a gate dielectric layer on a surface of a semiconductor substrate. Source/drain regions are provided along opposite sides of the gate electrode. The source and drain regions are generally heavily doped regions of the semiconductor substrate. Usually a capped silicide layer, for example, titanium silicide capped by titanium nitride, is used to couple contacts, e.g., active and/or metal contacts, to the source and drain regions. Including a nitrogen-containing capping layer, however, can undesirably contribute to contact resistance.

Further, during middle-of-line (MOL) processes, a minimum via resistance for the MOL structures are targeted. A liner material (e.g., titanium nitride) is often required to improve adhesion of metals to dielectric materials to pass post-processing steps such as chemical-mechanical planarization (CMP) and to enhance CVD nucleation. However, the presence of the liner adds to the via resistance.

Therefore, there is a need in the art for transistors and MOL applications with decreased resistance.

SUMMARY

One or more embodiments are directed to a contact stack of a semiconductor device, which comprises: a source/drain region; a metal silicide layer above the source/drain region; a metal cap layer in direct contact with the metal silicide layer; and a conductor in contact with the metal cap layer.

Additional embodiments are directed to a semiconductor device comprising: a contact stack on the substrate, a dielectric layer adjacent to the contact stack, and a metal gate adjacent to the dielectric layer. The contact stack comprises: a source/drain region comprising: silicon, germanium, silicon-germanium, or a group III/V compound semiconductor; a metal silicide layer on the source/drain region, the metal silicide layer comprising: titanium silicide, cobalt silicide, ruthenium silicide, nickel silicide, molybdenum silicide, or alloys thereof; a metal cap layer directly on the metal silicide layer, the metal cap layer comprising: tungsten, ruthenium, molybdenum, or alloys thereof; and a conductor on the metal cap layer.

Further embodiments are directed to a method comprising: depositing a metal silicide layer in a feature of a substrate in a first processing chamber, the feature comprising a bottom wall and sidewalls; moving the substrate to a second processing chamber that is integrated with the first processing chamber such that there is not an air break between the first and second processing chambers; preparing a metal cap layer directly on the metal silicide layer; and depositing a conductor on the metal cap layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
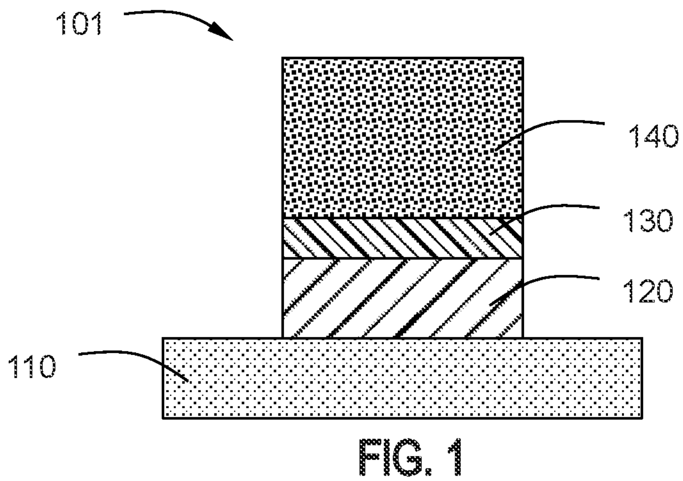
FIG. 1 is a cross-sectional view of a contact stack in accordance with one or more embodiments.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

As used herein, the term "fin field-effect transistor (FinFET)" refers to a MOSFET transistor built on a substrate where the gate is placed on two or three sides of the channel, forming a double- or triple-gate structure. FinFET devices have been given the generic name FinFETs because the channel region forms a "fin" on the substrate. FinFET devices have fast switching times and high current density.

As used herein, "consists essentially of" with respect to composition of a layer means that the stated elements compose greater than 95%, greater than 98%, greater than 99% or greater than 99.5% of the stated material on an atomic basis. For the avoidance of doubt, no stoichiometric ratios are implied by the identification of materials disclosed herein. For example, a TiSi material contains titanium and silicon. These elements may or may not be present at a 1:1 ratio.

Embodiments herein relate to contact stacks, semiconductor devices, and methods of making the same, which advantageously offer reduced resistance in transistor contacts. Resistance is reduced by eliminating nitrogen-based layers, e.g., a nitride cap layer and/or a nitride liner layer. Use of a metal-based cap layer on top of a silicide layer at contact areas, e.g., source and drain, eliminates the use of a nitrogen-based barrier film between silicide and conductor, e.g., plug metal. Contact resistance is advantageously reduced by direct contact between the silicide and plug metal, e.g., direct contact of silicide with different low resistivity metals (W, Ru, Mo, . . . ). The metal-based cap layer advantageously inhibits silicide from alteration by process chemicals ($O_2$, F, $Cl_2$, and the like).

Contact resistance (Ω) provides a measure of the opposition to electric current flow due to contacting interfaces. In a contact stack, a nitride-based cap according to prior art contributed upwards of 25% of the stack's contact resistance. Experiments of embodiments herein where a nitride-based cap (TiN) was replaced with a metal cap (W) resulted in a reduction in contact resistance on the order of 20%.

Metal cap layers herein are effective to inhibit and/or eliminate diffusion of undesirable elements into and/or silicon out of the underlying metal silicide layer. For example, a tungsten metal cap layer, e.g., having a thickness of about 20 to 30 Angstroms, is effective to inhibit and/or eliminate diffusion of one or more of: oxygen, argon, fluorine, silicon.

Processes according to one or more embodiments eliminate an air break, which facilitates the removal of a nitrogen-based cap layer. Deposition of a metal cap layer is done using low energy physical vapor deposition (PVD) technology, which replaces the use of chemical vapor deposition (CVD) and eliminates the need for a nitrogen-based liner for CVD nucleation. Low energy PVD technology also advantageously reduces potential for damage to the metal silicide layer.

According to one or more embodiments, the methods within the scope of the invention are particularly useful in forming FinFET devices and will be described in that context. Other devices and applications are also within the scope of the invention.

FIG. 1 illustrates a cross-sectional view of an exemplary contact stack 101 suitable for a semiconductor device. Stack 101 comprises a source/drain region 110. In some embodiments, the source/drain region 110 comprises silicon, germanium, silicon-germanium, or a group III/V compound semiconductor. Above the source/drain region 110 is a metal silicide layer 120. In some embodiments, the metal silicide layer 120 comprises: titanium silicide, cobalt silicide, or ruthenium silicide. In direct contact with the metal silicide layer 120 is a metal cap layer 130. In one or more embodiments, the contact stack 101 excludes a metal nitride layer in direct contact with the metal silicide layer. In one or more embodiments, the entire contact stack 101 excludes a metal nitride layer. In some embodiments, the metal cap comprises: tungsten, ruthenium, molybdenum, or alloys thereof. Above the metal cap layer is a conductor 140. In one or more embodiments, the metal cap layer is in contact with conductor 140. The conductor 140 may comprise a combination of layers to provide an active contact and/or a metal contact. In one or more embodiments, the conductor 140 comprises a metal selected from the group consisting of: tungsten, ruthenium, and cobalt.

In some embodiments, the metal silicide layer 120 comprises or consists essentially of TiSi. In some embodiments, the metal cap layer 130 comprises or consists essentially of tungsten (W).

Figure 2:
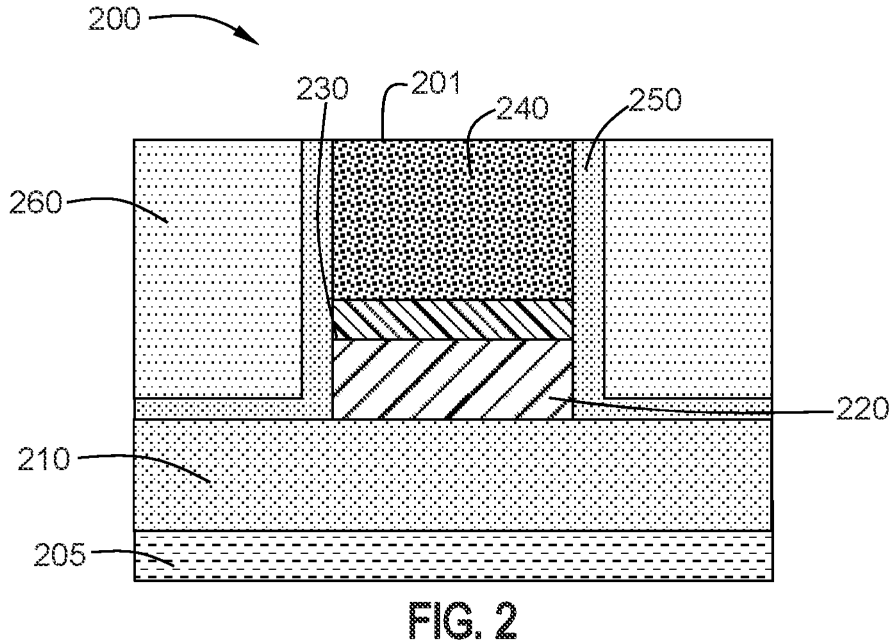
FIG. 2 is a cross-sectional view of a semiconductor device in accordance with one or more embodiments.

FIG. 2 illustrates a cross-sectional view of a semiconductor device 200 comprising: a substrate 205, a contact stack 201 on the substrate 205, a dielectric layer 250, and a metal gate 260. The contact stack 201 comprises: a source/drain region 210, a metal silicide layer 220 on the source/drain region 210, a metal cap layer 230 in direct contact with the metal silicide layer 220, and a conductor 240 above the metal cap layer 230. In one or more embodiments, the conductor 240 is in contact with the metal cap layer 230. In one or more embodiments, the conductor 240 is in direct contact with the metal cap layer 230.

As shown in FIG. 2, in one or more embodiments, the source/drain region 210 is formed on the substrate 205. In other embodiments, a source/drain region may be integral to and/or extend from a body of the substrate.

In some embodiments, the source/drain region 210 comprises silicon, germanium, silicon-germanium, or a group III/V compound semiconductor. In some embodiments, the metal silicide layer 220 comprises: titanium silicide, cobalt silicide, ruthenium silicide, nickel silicide, molybdenum silicide, or alloys thereof. In one or more embodiments, the contact stack 201 excludes a metal nitride layer on the metal silicide layer. In one or more embodiments, the entire contact stack 201 excludes a metal nitride layer. In some embodiments, the metal cap layer 230 comprises: tungsten, ruthenium, molybdenum, or alloys thereof. The conductor 240 may comprise a combination of layers to provide an active contact and/or a metal contact. In one or more embodiments, the conductor 240 comprises a metal selected from the group consisting of: tungsten, ruthenium, and cobalt.

The dielectric layer 250 insulates the contact stack 201 from the metal gate 260. In one or more embodiments, the dielectric layer directly contacts the contact stack. In one or more embodiments, the semiconductor device 200 excludes a metal nitride layer between the contact stack 201 and the dielectric layer 250. In one or more embodiments, the entire semiconductor device 200 excludes a metal nitride layer. In one or more embodiments, the dielectric layer 250 comprises a dielectric material, such as an oxide or a nitride, for example: SiOx (e.g., $SiO_2$), SiN, SiCN, or other suitable dielectric material.

In some embodiments, the metal silicide layer 220 comprises or consists essentially of TiSi. In some embodiments, the metal cap layer 230 comprises or consists essentially of tungsten (W).

In some embodiments, the metal silicide layer has a thickness of greater than or equal to 20 Å to less than or equal to 60 Å, and all values and subranges therebetween. In some embodiments, the metal silicide layer has a thickness of about 40 Å, which includes 40 Å±10%. In one or more embodiments, the metal silicide layer is a selectively deposited layer. In one or more embodiments, the metal silicide layer is a selective layer of TiSi.

In some embodiments, the metal cap layer has a thickness of greater than or equal to 10 Å to less than or equal to 50 Å, and all values and subranges therebetween. In some embodiments, the metal cap layer has a thickness of about 30 Å, which includes 30 Å±10%. In one or more embodiments, the metal cap layer is deposited by a PVD process.

Figure 3A:
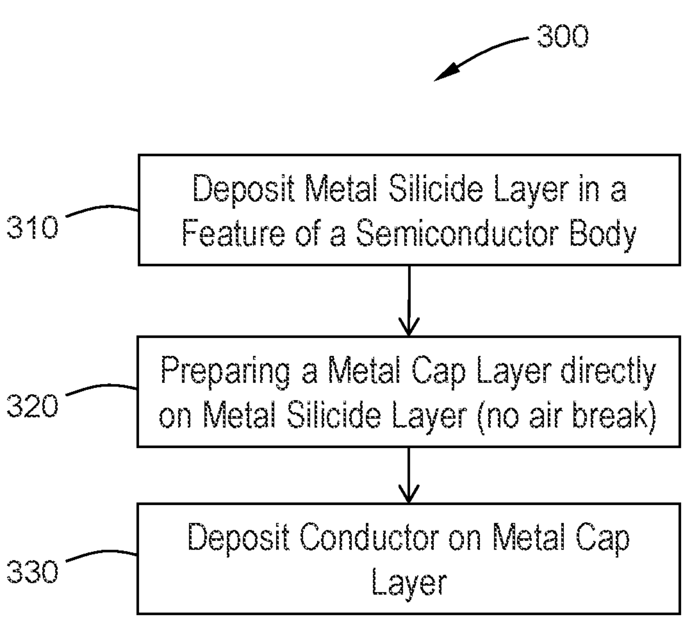
FIG. 3A is a flowchart of a method for forming a contact stack according to FIG. 1 in accordance with one or more embodiments.
Figure 3B:
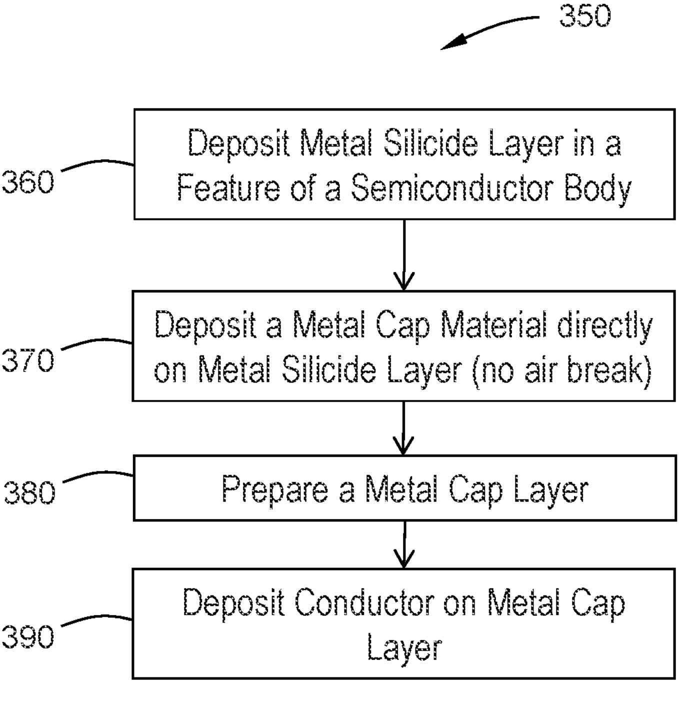
FIG. 3B is a flowchart of a method for forming a contact stack according to one or more embodiments.

Referring to FIG. 3A, a general embodiment relates to a method 300 of manufacturing a contact stack of a semiconductor device. The method 300 starts at operation 310 by depositing a metal silicide layer in a feature of a substrate. At operation 320, a metal cap layer is prepared directly on the metal silicide layer in the absence of an air break. For example, operation 310 is conducted in a first chamber that is integrated with a second chamber where operation 320 is conducted. At operation 330, a conductor is deposited on the metal cap layer. In one or more embodiments, operation 330 is conducted in a third chamber. In one or more embodiments, the method comprises: depositing a metal silicide layer in the feature of a substrate in a first processing chamber; moving the substrate to a second processing chamber that is integrated with the first processing chamber such that there is not an air break between the first and second processing chambers; preparing a metal cap layer directly on the metal silicide layer; and depositing a conductor on the metal cap layer.

Figure 4A:
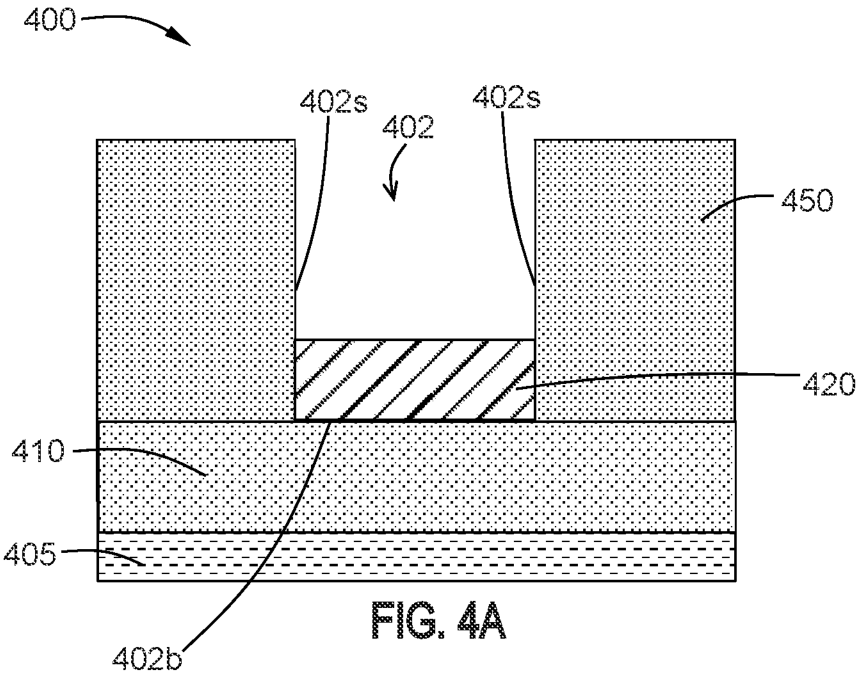
FIGS. 4A-4H illustrate various views of a stack during different stages of the method of FIG. 3B.

Referring to FIGS. 3B to 4A-4H, another embodiment relates to a method 350 of manufacturing a contact stack of a semiconductor device 400. The method 350 starts at operation 360 by depositing a metal silicide layer 420 in a feature 402 of a substrate 405 as shown in FIG. 4A. In one or more embodiments, the feature 402 comprises a source/drain region 410 as a bottom wall 402*b*, and sidewalls 402*s* comprising a dielectric material 450.

The feature 402 may be formed by methods known in the art. As an example, the feature 402 may be a trench prepared by etching a dielectric layer to reach a source/drain region and there after by a pre-cleaning process (e.g., wet etch and/or dry etch) to remove contaminants. The wet etch process may utilize ammonia or hydrogen fluoride solution. The dry etch process may be a plasma etch process and may utilize a fluorine or hydrogen containing etchant. The pre-clean process would not substantially remove any portion of the source/drain region.

Reference to "source/drain region" is a source region or a drain region or a merged source and drain region. In one or more embodiments, the source/drain region 410 is fabricated from a semiconductor material that is grown epitaxially on one or more surfaces of the substrate 405.

In one or more embodiments, the metal silicide layer 420 is deposited selectively onto the bottom wall 402*b*. In one or more embodiments, the metal silicide layer 420 is deposited by a selective epitaxial deposition process such that the metal silicide layer 420 is formed on the bottom 402*b* of the feature 402, and not on sidewalls 402*s* of the feature 402 as a result of the selective epitaxial deposition process.

In general, any suitable precursors can be used for the metal silicide layer. For a titanium silicide layer, titanium precursors can include, but are not limited to $TiCl_4$, $TiBr_4$, $TiI_4$, $TiF_4$, tetrakisdimethylamino titanium; silicon-based precursors can include but are not limited to silanes (e.g., silane ($Si_1H_4$), disilane ($Si_2H_6$), trisilane ($Si_3H_8$), tetrasilane ($Si_4H_{10}$), isotetrasilane, neopentasilane ($Si_5H_{12}$), cyclopentasilane ($Si_5H_{10}$), hexasilane ($C_6H_{14}$), cyclohexasilane ($Si_6H_{12}$) or, in general, $Si_zH_a$ where z=1 or more, and combinations thereof), organosilanes, and/or halosilanes (of $Si_gH_hX_i$, where each X is a halogen independently selected from F, Cl, Br and I, g is any integer greater than or equal to 1, h and i are each less than or equal to 2g+2 and h+i is equal to 2g+2) as a co-reactant.

The order in which the substrate is exposed to the precursors can be varied. The exposures may repeat in a deposition cycle. Further, exposure to a precursor may be repeated within a single deposition cycle.

Figure 4B:
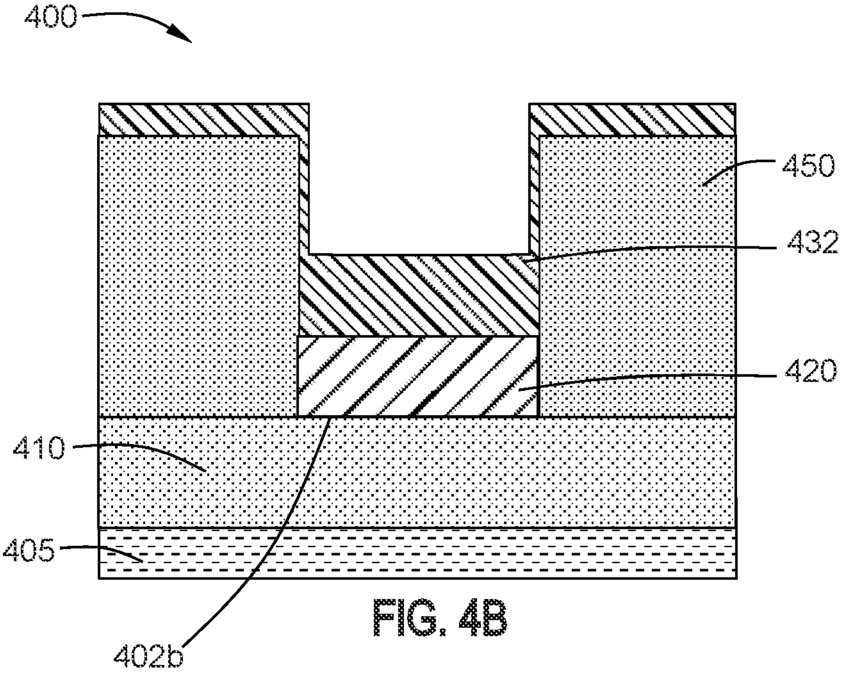

At operation 370, a metal cap material 432 is deposited directly on the metal silicide layer 420, as shown in FIG. 4B, in the absence of an air break. In one or more embodiments, operations 360 and 370 are conducted in different processing chambers that are integrated. As such, transfer between the chambers is performed without breaking vacuum and/or without exposure to ambient air.

An exemplary process for depositing the metal cap material directly on the metal silicide layer is by a physical vapor deposition (PVD) process. In one or more embodiments, depositing the metal cap material directly on the metal silicide layer is conducted in (PVD) process chamber. In one or more embodiments, the conditions of the PVD process chamber are low energy. In one or more embodiments, the PVD process chamber is a RF-PVD process chamber. In one or more embodiments, temperature of the PVD chamber within a range of room temperature (e.g., 25° C.) to 600° C., including all values and subranges therebetween. In one or more embodiments, bias is in a range of 0 W to 400 W, including all values and subranges therebetween. In one or more embodiments, direct current is in a range of 0 W to 500 W. In one or more embodiments, radio frequency is in range of 1 kHz to 10 KHz.

In an embodiment, the PVD chamber has conditions of: a chamber temperature of 350° C. to 450° C.; a chamber pressure of 120 mT±50 mT; a bias in a range of 0 W to 200 W; a direct current (DC) in a range of 0 W to 500 W; and a radio frequency (RF) in a range of 1 kHz to 10 KHz. In one or more embodiments, the PVD chamber has conditions of: a chamber temperature of 400° C.±50° C.; a chamber pressure of 120 mT±50 mT; a bias in a range of 0 W to 200 W; a direct current (DC) of 500 W±50 W; and a radio frequency (RF) of 3 kHz±1 kHz. In one or more embodiments, the PVD process is a plasma-enhanced PVD. In one or more embodiments, the plasma-enhanced PVD includes a pulsed radio frequency (RF) plasma.

According to one or more embodiments, deposition of the metal cap material 432 is by bottom fill as shown in FIG. 4B, which requires further processing to prepare a metal cap layer 430 at operation 380 prior to deposition of a conductor at operation 390.

In general, any suitable metal cap precursor can be used for the metal cap material and/or metal cap layer.

Figure 4C:
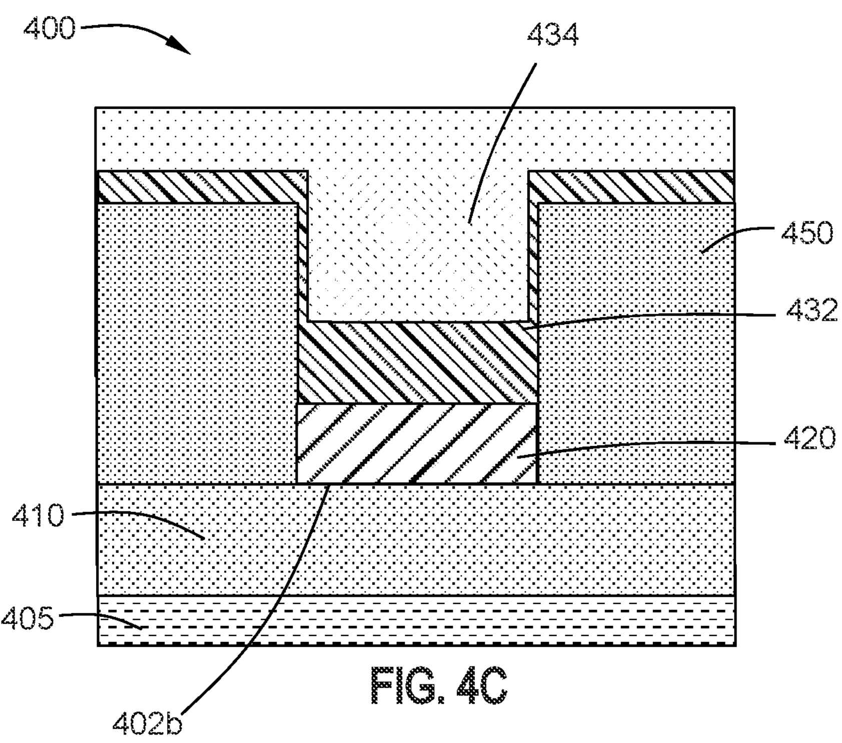

Operation 380 to prepare a metal cap layer includes FIGS. 4C-4G. In FIG. 4C, according to one or more embodiments, a material 434, which may be a spin-on or gap-fill material, is deposited over the entirety of the device 400. In one or more embodiments, the material 434 is a spin-on material, which is a carbon-based material. In one or more embodiments, the material 434 is a CVD gap-fill material, which is a dielectric material.

Figure 4D:
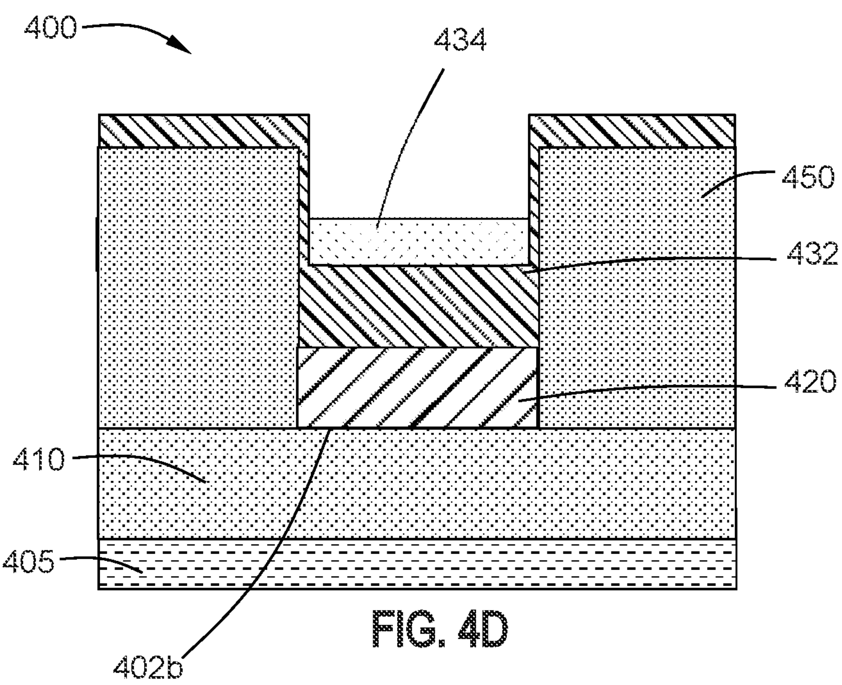

FIG. 4D, according to one or more embodiments, depicts etching of at least a portion of the material 434. For spin-on material, etching may be conducted by a dry etch process, which may utilize a plasma etch process and may utilize a hydrogen or nitrogen or oxygen containing etchant. For tungsten material, etching may be conducted by a dry etch process, which may utilize oxidizing exposed tungsten followed by $WF_6$. Alternatively, according to one or more embodiments, after depositing the material 434 shown in FIG. 4C, a chemical mechanical polishing (CMP) of at least a portion of the material and the metal cap layer above the dielectric material may be applied followed by an etching of at least a portion of the material 434 in the trench.

Figure 4E:
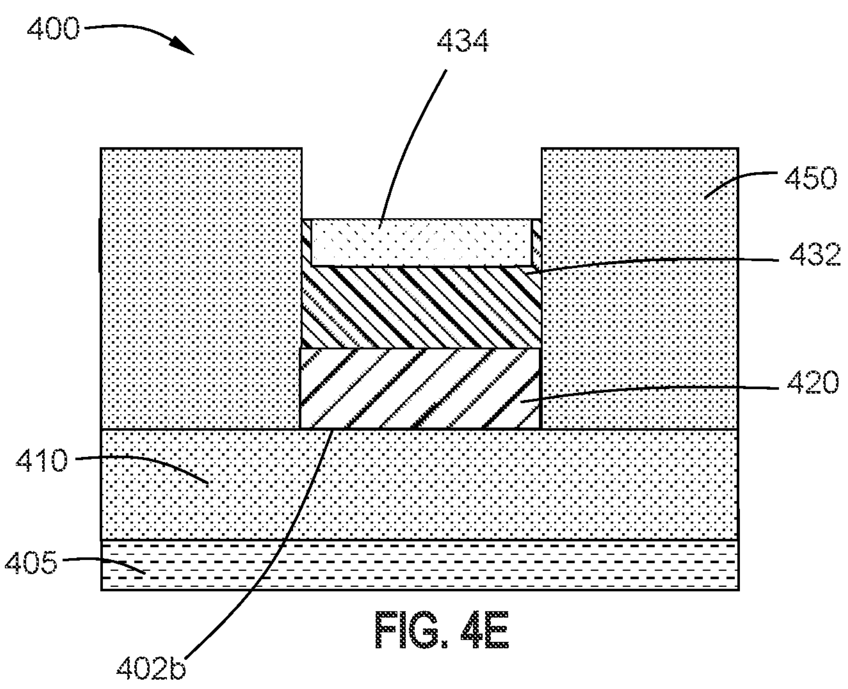

In FIG. 4E, the metal cap material 432 is etched to remove the metal cap material 432 from a portion of the sidewalls 402*s* above the material 434 and the top surfaces of the dielectric material 450.

Figure 4F:
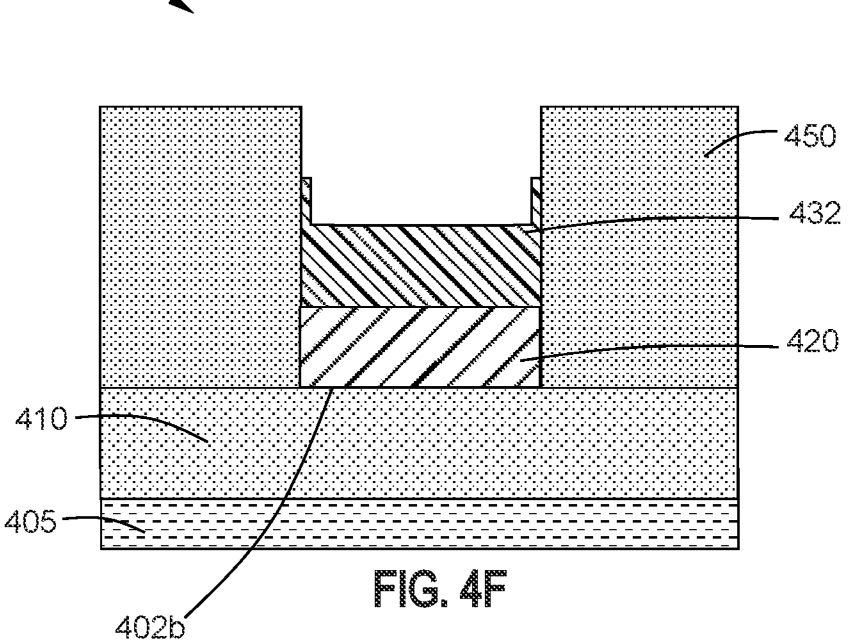

In FIG. 4F, the remaining material 434 is etched away, leaving the metal cap material 432 exposed.

Figure 4G:
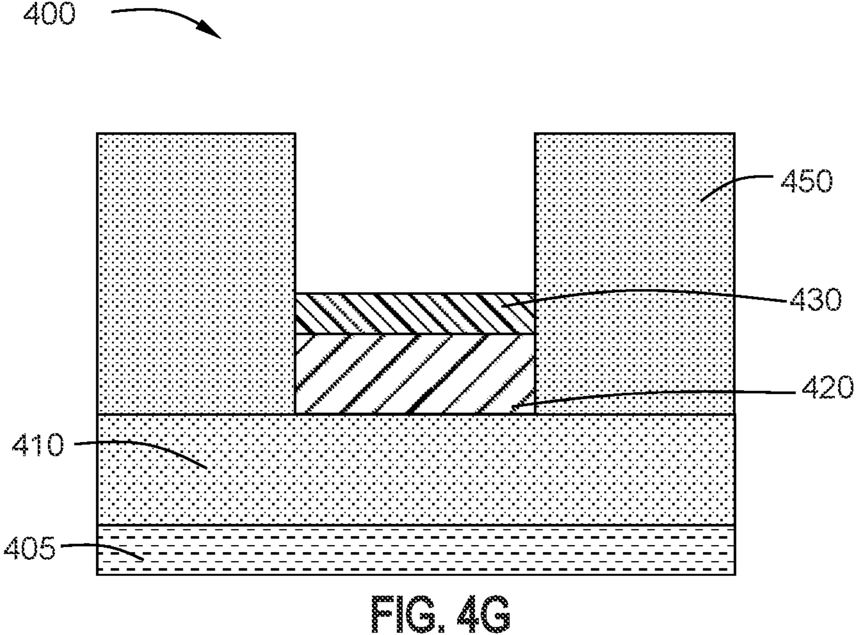

In FIG. 4G, the exposed metal cap material 432 is etched (e.g., wet etch and/or dry etch) to form a metal cap layer 430. An etching with oxygen-, fluorine-, or chlorine-based gas may be conducted, for example.

Figure 4H:
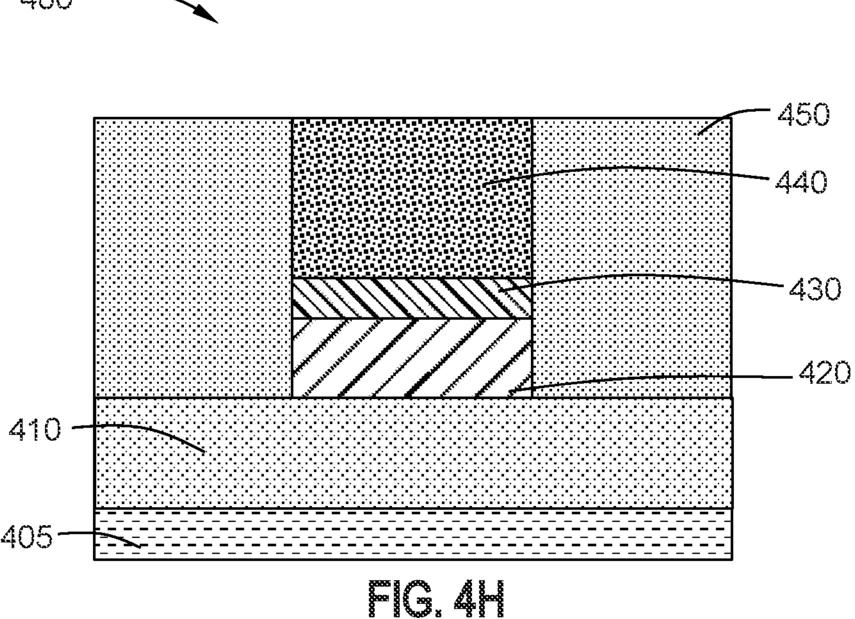

After formation of the metal cap layer 430, at operation 390 and shown in FIG. 4H, a conductor 440 is deposited on the metal cap layer 430. The conductor 440 is fabricated from an electrically conductive material, such as a metal. In one or more embodiments, the conductor comprises a metal selected from the group consisting of: tungsten, ruthenium, and cobalt. Optionally, prior to deposition of the conductor 440 there is a pre-clean operation conducted. In one or more embodiments, the pre-clean operation prior to deposition of the conductor comprises a plasma treatment, e.g., hydrogen plasma.

In one or more embodiments, the conductor is deposited by a selective deposition method. In one or more embodiments, the conductor is deposited by a CVD process and/or a PVD process.

In general, any suitable precursor can be used for the conductor. For example, precursors of a tungsten conductor can include, but are not limited to $WCl_6$, $WBr_6$, $WI_6$, $WF_6$.

Consistent with the foregoing, methods of this disclosure can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, a suitable processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools may be adapted for the present. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, anneal, orientation, hydroxylation and other substrate processes. By carrying out processes in a chamber on a cluster tool, surface contamination of the substrate with atmospheric impurities can be avoided without oxidation prior to depositing a subsequent film.

In some embodiments, the first processing chamber and the second processing chamber are part of the same, clustered, processing tool. Accordingly, in some embodiments, the method is an in-situ integrated method.

In some embodiments, the first processing chamber and the second processing chamber are different processing tools. Accordingly, in some embodiments, the method is an ex-situ integrated method.

According to one or more embodiments, the substrate is continuously under vacuum or "load lock" conditions and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrates are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, and/or cleaning processes throughout the carousel path.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Figure 5:
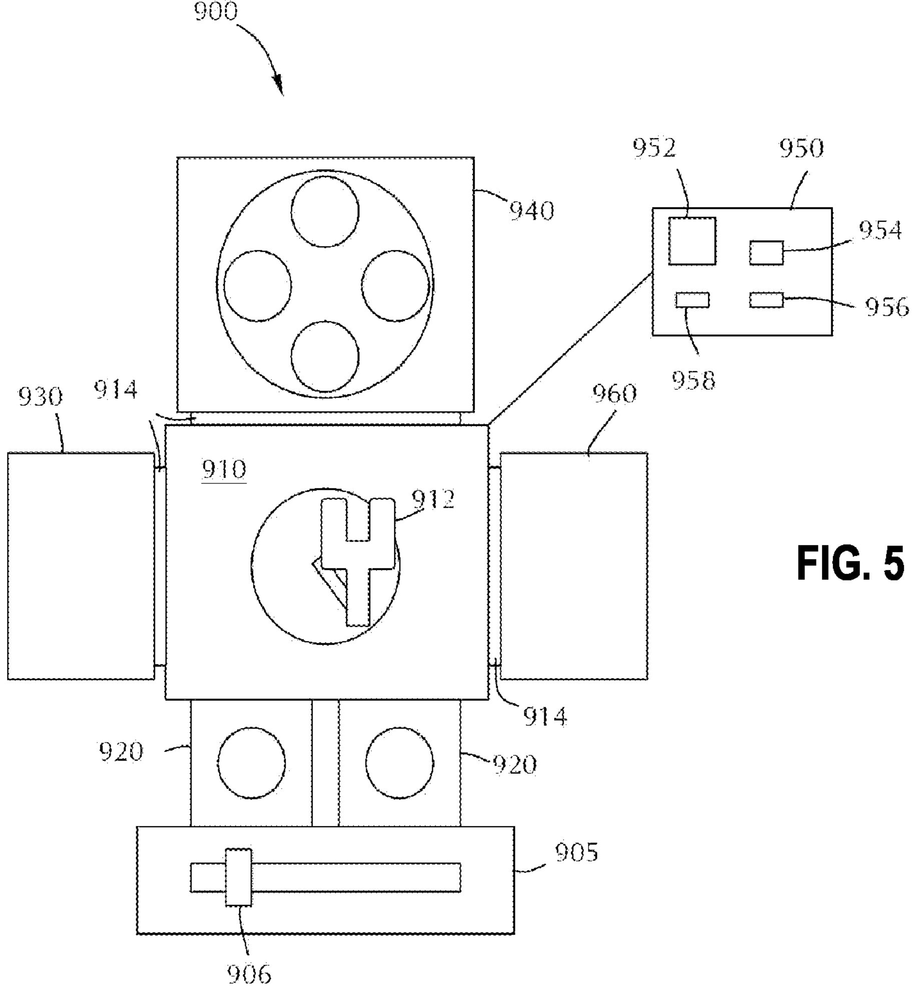
FIG. 5 is a cluster tool accordance with one or more embodiments.

With reference to FIG. 5, additional embodiments of the disclosure are directed to a processing system 900 for executing the methods described herein. FIG. 5 illustrates a system 900 that can be used to process a substrate according to one or more embodiments of the disclosure. The system 900 can be referred to as a cluster tool. The system 900 includes a central transfer station 910 with a robot 912 therein. The robot 912 is illustrated as a single blade robot; however, those skilled in the art will recognize that other robot 912 configurations are within the scope of the disclosure. The robot 912 is configured to move one or more substrate between chambers connected to the central transfer station 910.

At least one pre-clean/buffer chamber 920 is connected to the central transfer station 910. The pre-clean/buffer chamber 920 can include one or more of a heater, a radical source or plasma source. The pre-clean/buffer chamber 920 can be used as a holding area for an individual semiconductor substrate or for a cassette of wafers for processing. The pre-clean/buffer chamber 920 can perform pre-cleaning processes or can pre-heat the substrate for processing or can simply be a staging area for the process sequence. In some embodiments, there are two pre-clean/buffer chambers 920 connected to the central transfer station 910.

In the embodiment shown in FIG. 5, the pre-clean chambers 920 can act as pass through chambers between the factory interface 905 and the central transfer station 910. The factory interface 905 can include one or more robot 906 to move substrate from a cassette to the pre-clean/buffer chamber 920. The robot 912 can then move the substrate from the pre-clean/buffer chamber 920 to other chambers within the system 900.

A first processing chamber 930 can be connected to the central transfer station 910. The first processing chamber 930 can be configured as an epitaxy chamber for (selectively) depositing a metal silicide layer and may be in fluid communication with one or more reactive gas sources to provide one or more flows of reactive gases to the first processing chamber 930. The substrate can be moved to and from the processing chamber 930 by the robot 912 passing through isolation valve 914.

Processing chamber 940 can also be connected to the central transfer station 910. In some embodiments, processing chamber 940 comprises physical vapor deposition (PVD) chamber for depositing a metal cap material and/or layer and is fluid communication with one or more reactive gas sources to provide flows of reactive gas to the processing chamber 940. In some embodiments, processing chamber 940 is an RF-PVD chamber. The substrate can be moved to and from the processing chamber 940 by robot 912 passing through isolation valve 914.

In some embodiments, processing chamber 960 is connected to the central transfer station 910 and is configured to act as a conductor deposition chamber. The processing chamber 960 can be configured to perform one or more different selective deposition (e.g., CVD or PVD) processes.

In some embodiments, each of the processing chambers 930, 940, and 960 are configured to perform different portions of the processing method. For example, processing chamber 930 may be configured to perform the metal silicide layer deposition process, processing chamber 940 may be configured to perform the metal cap material and/or layer deposition process, and processing chamber 960 may be configured to perform a conductor deposition process. The skilled artisan will recognize that the number and arrangement of individual processing chamber on the tool can be varied and that the embodiment illustrated in FIG. 5 is merely representative of one possible configuration.

In some embodiments, the processing system 900 includes one or more metrology stations. For example, metrology stations can be located within pre-clean/buffer chamber 920, within the central transfer station 910 or within any of the individual processing chambers. The metrology station can be any position within the system 900 that allows the distance of the recess to be measured without exposing the substrate to an oxidizing environment.

At least one controller 950 is coupled to one or more of the central transfer station 910, the pre-clean/buffer chamber 920, processing chambers 930, 940, or 960. In some embodiments, there are more than one controller 950 connected to the individual chambers or stations and a primary control processor is coupled to each of the separate processors to control the system 900. The controller 950 may be one of any form of general-purpose computer processor, microcontroller, microprocessor, etc., that can be used in an industrial setting for controlling various chambers and subprocessors.

The at least one controller 950 can have a processor 952, a memory 954 coupled to the processor 952, input/output devices 956 coupled to the processor 952, and support circuits 958 to communication between the different electronic components. The memory 954 can include one or more of transitory memory (e.g., random access memory) and non-transitory memory (e.g., storage).

The memory 954, or computer-readable medium, of the processor may be one or more of readily available memory such as random access memory (RAM), read-only memory (ROM), floppy disk, hard disk, or any other form of digital storage, local or remote. The memory 954 can retain an instruction set that is operable by the processor 952 to control parameters and components of the system 900. The support circuits 958 are coupled to the processor 952 for supporting the processor in a conventional manner. Circuits may include, for example, cache, power supplies, clock circuits, input/output circuitry, subsystems, and the like.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the methods of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 950 has one or more configurations to execute individual processes or sub-processes to perform the method. The controller 950 can be connected to and configured to operate intermediate components to perform the functions of the methods. For example, the controller 950 can be connected to and configured to control one or more of gas valves, actuators, motors, slit valves, vacuum control, etc.

The controller 950 of some embodiments has one or more configurations selected from: a configuration to move a substrate on the robot between the plurality of processing chambers and metrology station; a configuration to load and/or unload substrates from the system; a configuration to deposit a metal silicide layer, which in one or more embodiments comprises TiSi; a configuration to deposit a metal cap layer, which in one or more embodiments comprises W, directly on the metal silicide layer; and/or a configuration to deposit a conductor, which in one or more embodiments comprises W.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of forming a semiconductor device, the method comprising:

depositing a metal silicide layer in a feature of a semiconductor substrate in a first processing chamber, the feature comprising a bottom wall and sidewalls;

moving the semiconductor substrate to a second processing chamber that is integrated with the first processing chamber such that there is not an air break between the first and second processing chambers;

forming a metal cap layer directly on the metal silicide layer, the metal cap layer comprising a metal cap material selected from the group consisting of tungsten, ruthenium, molybdenum, and alloys thereof, and the metal cap layer formed by a low energy physical vapor deposition (PVD) process of the metal cap material; and depositing a conductor on the metal cap layer.

2. The method of claim 1, wherein the feature comprises a source/drain region as the bottom wall, and a dielectric material as the sidewalls.

3. The method of claim 1, wherein the metal silicide layer is deposited selectively on the bottom wall.

4. The method of claim 1, wherein the conductor is deposited selectively on the metal cap layer.

5. The method of claim 1, wherein the PVD process is conducted under conditions of: a chamber temperature of 350° C. to 450° C.; a chamber pressure of 120 mT±50 mT; a bias in a range of 0 W to 200 W; a direct current (DC) of 0 W to 500 W; and a radio frequency (RF) in a range of 1 kHz to 10 KHz.

6. The method of claim 1, wherein the forming the metal cap layer comprises depositing the metal cap material by the PVD process, depositing a spin-on or gap-fill material, and thereafter etching at least a portion of the spin-on or gap-fill material and the metal cap material.

7. The method of claim 6, further comprising etching a remaining portion of the metal cap material.

8. The method of claim 1, wherein the forming the metal cap layer comprises depositing the metal cap material by the PVD process, depositing a spin-on or gap-fill material, and thereafter chemical mechanical polishing (CMP) at least a portion of the spin-on or gap-fill material and the metal cap material.

9. The method of claim 8, further comprising etching a remaining portion of the metal cap material.

10. The method of claim 1, wherein the metal silicide layer comprises: titanium silicide, cobalt silicide, ruthenium silicide, nickel silicide, molybdenum silicide, or alloys thereof.

11. The method of claim 10, wherein the metal silicide layer comprises molybdenum silicide or an alloy of molybdenum silicide and titanium silicide.

12. The method of claim 10, wherein the metal silicide layer consists essentially of titanium silicide.

13. The method of claim 1, wherein the conductor comprises a metal selected from the group consisting of: tungsten, ruthenium, and cobalt.

14. The method of claim 1, wherein the metal silicide layer has a thickness of greater than or equal to 20 Å to less than or equal to 60 Å.

15. The method of claim 14, wherein the metal silicide layer has a thickness of about 40 Å.

16. The method of claim 1, wherein the metal cap layer has a thickness greater than or equal to 10 Å to less than or equal to 50 Å.

17. The method of claim 16, wherein the metal cap layer has a thickness of about 30 Å.

18. The method of claim 1, wherein the metal cap layer reduces contact resistance of the semiconductor device by 20% when compared to nitride-based caps.

19. The method of claim 1, wherein the metal cap material consists essentially of tungsten (W).

20. A non-transitory computer readable medium including instructions, that, when executed by a controller of a processing chamber, causes the processing chamber to perform operations of:

depositing a metal silicide layer in a feature of a semiconductor substrate in a first processing chamber, the feature comprising a bottom wall and sidewalls;

moving the semiconductor substrate to a second processing chamber that is integrated with the first processing chamber such that there is not an air break between the first and second processing chambers;

forming a metal cap layer directly on the metal silicide layer, the metal cap layer comprising a metal cap material selected from the group consisting of tungsten, ruthenium, molybdenum, and alloys thereof, and the metal cap layer formed by a low energy physical vapor deposition (PVD) process of the metal cap material; and depositing a conductor on the metal cap layer.

* * * * *